United States Patent
Tsunekawa et al.

(10) Patent No.: US 8,837,924 B2
(45) Date of Patent: Sep. 16, 2014

(54) VACUUM HEATING/COOLING APPARATUS AND MANUFACTURING METHOD OF MAGNETORESISTANCE ELEMENT

(75) Inventors: Koji Tsunekawa, Tokyo (JP); Yoshinori Nagamine, Tama (JP); Shinji Furukawa, San Jose, CA (US)

(73) Assignee: Canon Anelva Corporation, Kawasaki-shi (JP)

( * ) Notice: Subject to any disclaimer, the term of this patent is extended or adjusted under 35 U.S.C. 154(b) by 57 days.

(21) Appl. No.: 13/307,673

(22) Filed: Nov. 30, 2011
(Under 37 CFR 1.47)

(65) Prior Publication Data
US 2012/0193071 A1 Aug. 2, 2012

Related U.S. Application Data

(63) Continuation of application No. PCT/JP2010/056855, filed on Apr. 16, 2010.

(30) Foreign Application Priority Data

Jun. 24, 2009 (JP) ................................ 2009-150055

(51) Int. Cl.
*F27B 5/14* (2006.01)
*F27B 5/16* (2006.01)
*F27D 5/00* (2006.01)
*H01L 21/68* (2006.01)
*H01L 43/12* (2006.01)
*H01L 21/67* (2006.01)

(52) U.S. Cl.
CPC ...... *H01L 21/6719* (2013.01); *H01L 21/67115* (2013.01); *H01L 21/67109* (2013.01); *H01L 43/12* (2013.01)
USPC ........... 392/416; 392/418; 219/390; 219/411; 118/724; 118/729

(58) Field of Classification Search
None
See application file for complete search history.

(56) References Cited

U.S. PATENT DOCUMENTS 5,290,381 A * 3/1994 Nozawa et al. .......... 156/345.27
5,382,311 A * 1/1995 Ishikawa et al. ......... 156/345.54
(Continued)

FOREIGN PATENT DOCUMENTS

EP 2 073 286 A1 6/2009
JP 5-251377 A 9/1993
(Continued)

OTHER PUBLICATIONS

Isogami et al., "In Situ Heat Treatment of Ultrathin MgO Layer for Giant Magnetoresistance Ratio with Low Resistance Area Product in CoFeB/MgO/CoFeB Magnetic Tunnel Junctions," Applied Physics Letters, 93, 192109 (2008).

(Continued)

*Primary Examiner* — Joseph M Pelham
(74) *Attorney, Agent, or Firm* — Fitzpatrick, Cella, Harper & Scinto

(57) ABSTRACT

The present invention provides a vacuum heating/cooling apparatus capable of rapidly heating and also rapidly cooling only a substrate while a high vacuum degree is maintained after film-formation processing. The vacuum heating/cooling apparatus according to an embodiment of the present invention includes a vacuum chamber (1), a halogen lamp (2) which emits heating light, a quartz window (3) for allowing the heating light to enter the vacuum chamber (1), a substrate supporting base (9) having a cooling function, and a lift pin (13) which causes the substrate (5) to stand still at a heating position P3 and a cooling position P1 and moves the substrate (5) between the heating position P3 and the cooling position P1.

6 Claims, 11 Drawing Sheets

(56) References Cited

U.S. PATENT DOCUMENTS

| | | | |
|---|---|---|---|
| 5,802,856 A * | 9/1998 | Schaper et al. | 62/3.7 |
| 6,136,163 A | 10/2000 | Cheung et al. | |
| 6,433,661 B1 | 8/2002 | Mita et al. | |
| 6,454,898 B1 * | 9/2002 | Collins et al. | 156/345.1 |
| 6,477,787 B2 * | 11/2002 | Morad et al. | 34/412 |
| 6,616,816 B2 | 9/2003 | Sakai | |
| 6,658,763 B2 * | 12/2003 | Morad et al. | 34/412 |
| 6,833,107 B2 * | 12/2004 | Kuriyama et al. | 266/249 |
| 6,841,395 B2 | 1/2005 | Linn et al. | |
| 7,226,488 B2 | 6/2007 | Gat | |
| 7,378,618 B1 | 5/2008 | Sorabji et al. | |
| 7,479,394 B2 | 1/2009 | Horng et al. | |
| 7,780,820 B2 | 8/2010 | Zhao et al. | |
| 7,812,286 B2 * | 10/2010 | Sorabji et al. | 219/390 |
| 7,978,963 B2 * | 7/2011 | Shimizu et al. | 392/411 |
| 8,119,018 B2 | 2/2012 | Ikemoto et al. | |
| 8,227,729 B2 * | 7/2012 | Sorabji et al. | 219/411 |
| 2001/0040155 A1 * | 11/2001 | Womack et al. | 219/390 |
| 2001/0054389 A1 | 12/2001 | Sago et al. | |
| 2002/0005168 A1 | 1/2002 | Kraus et al. | |
| 2003/0037882 A1 | 2/2003 | Arita et al. | |
| 2003/0192646 A1 * | 10/2003 | Wu et al. | 156/345.49 |
| 2004/0035847 A1 | 2/2004 | Gat | |
| 2004/0040933 A1 * | 3/2004 | Kanno et al. | 216/67 |
| 2005/0183854 A1 | 8/2005 | Gat | |
| 2006/0056115 A1 | 3/2006 | Djayaprawira et al. | |
| 2006/0076109 A1 * | 4/2006 | Holland et al. | 156/345.27 |
| 2007/0091668 A1 | 4/2007 | Ho et al. | |
| 2007/0102118 A1 * | 5/2007 | Holland et al. | 156/345.27 |
| 2007/0111332 A1 | 5/2007 | Zhao et al. | |
| 2008/0014363 A1 | 1/2008 | Sago et al. | |
| 2008/0055793 A1 | 3/2008 | Djayaprawira et al. | |
| 2008/0124454 A1 | 5/2008 | Djayaprawira et al. | |
| 2008/0142497 A1 * | 6/2008 | Sorabji et al. | 219/393 |
| 2008/0156440 A1 * | 7/2008 | Sago et al. | 156/345.34 |
| 2008/0180862 A1 | 7/2008 | Djayaprawira et al. | |
| 2009/0308537 A1 * | 12/2009 | Shibuya et al. | 156/345.35 |
| 2010/0304185 A1 | 12/2010 | Zhao et al. | |
| 2010/0320076 A1 | 12/2010 | Zhao et al. | |
| 2011/0008740 A1 | 1/2011 | Sorabji et al. | |
| 2011/0094875 A1 | 4/2011 | Djayaprawira et al. | |
| 2011/0253037 A1 | 10/2011 | Tsunekawa et al. | |
| 2012/0193071 A1 * | 8/2012 | Tsunekawa et al. | 165/61 |

FOREIGN PATENT DOCUMENTS

| | | |
|---|---|---|
| JP | 6-13324 A | 1/1994 |
| JP | 7-254545 A | 10/1995 |
| JP | 2886101 B2 | 2/1999 |
| JP | 2001-102211 A | 4/2001 |
| JP | 2001-148379 A | 5/2001 |
| JP | 2001-196363 A | 7/2001 |
| JP | 2002-53956 A | 2/2002 |
| JP | 2002-76105 A | 3/2002 |
| JP | 2002-541428 A | 12/2002 |
| JP | 2003-13215 A | 1/2003 |
| JP | 2003-124134 A | 4/2003 |
| JP | 3451137 B2 | 7/2003 |
| JP | 3451166 B2 | 7/2003 |
| JP | 2003-318076 A | 11/2003 |
| JP | 3660254 B2 | 3/2005 |
| JP | 2006-80116 A | 3/2006 |
| JP | 3862660 B2 | 10/2006 |
| JP | 2007-142424 A | 6/2007 |
| JP | 2007-173843 A | 7/2007 |
| JP | 2008-166706 A | 7/2008 |
| TW | 459270 | 10/2001 |
| TW | 200717517 | 5/2007 |
| TW | 200826199 A | 6/2008 |
| WO | 2008/032745 A1 | 3/2008 |

OTHER PUBLICATIONS

Tsunekawa et al., "Deposition and Micro-fabrication Process for Magnetic Tunnel Junctions in Semiconductor Manufacturing Lines", MAGNE, 2(7), pp. 358-363 (2007).

English translation of the International Preliminary Report on Patentability in PCT/JP2010/056858 (9 pages) (Jan. 26, 2012).

Office Action in British Patent Application No. 1200097.2, issued May 10, 2013 (4 pages).

Office Action in Taiwan Patent Application No. 099116676, issued Jun. 20, 2013 (24 pages).

* cited by examiner

VACUUM HEATING/COOLING APPARATUS AND MANUFACTURING METHOD OF MAGNETORESISTANCE ELEMENT

CROSS-REFERENCES TO RELATED APPLICATIONS

This application is a continuation application of International Application No. PCT/JP2010/056855, filed Apr. 16, 2010, which claims the benefit of Japanese Patent Application No. 2009-150055, filed Jun. 24, 2009. The contents of the aforementioned applications are incorporated herein by reference in their entities.

TECHNICAL FIELD

The present invention relates to a vacuum heating/cooling apparatus which heats/cools a substrate of a semiconductor device, an electronic device, a magnetic device, a display device and the like in vacuum at a high speed and to a manufacturing method of a magnetoresistance element.

BACKGROUND ART

A tunnel magnetoresistance element having an MgO tunnel barrier layer used as a sensor element of a magnetic random access memory (MRAM) or a magnetic head forms a structure in which a metal film (a magnetic film and a non-magnetic film) and an insulator film are laminated in multiple layers. Such a magnetoresistance element is film-formed by a sputtering method excellent in productivity and then, by applying heat treatment while applying a high magnetic field at 1 tesla or more in another apparatus (heat treatment furnace in magnetic field) (See Non-Patent Document 1). As a method of forming an MgO tunnel barrier layer, a direct sputtering film-forming method by RF sputtering of an MgO target (See Patent Document 1), a method in which a metal Mg film is formed in an oxygen atmosphere by a reactive sputtering method after a metal Mg film is formed and then, oxidation treatment is applied at the last stage (See Patent Document 2), a method in which oxidation treatment is applied after a metal Mg film is formed and then, a metal Mg film is formed again at the last stage (See Patent Document 3), a method in which oxidation treatment is applied after a metal Mg film is formed and it is subjected to heat treatment and then, a metal Mg film is formed again and subjected to oxidation treatment (See Patent Document 4) and the like are disclosed.

As a method of forming an MgO tunnel barrier layer with a higher quality, as disclosed in Non-Patent Document 2, a method is known in which immediately after an MgO target is directly subjected to sputtering film formation by RF sputtering, a substrate is irradiated with infrared rays while the substrate is held in vacuum, and crystallization of an MgO film is promoted.

As a method of heating the substrate in vacuum at a high speed, in a step of forming a semiconductor element, as disclosed in Patent Document 5, a method is known in which a window which transmits heating light through a vacuum seal member such as an O-ring is provided in a vacuum chamber, and the substrate held in the vacuum chamber is heated by a radiation energy source which is arranged on the atmosphere side and radiates heating light such as an infrared lamp or the like.

Also, as a method of rapidly cooling a heated substrate, a method of cooling the substrate by moving it to a room adjacent to a heating chamber and thermally isolated therefrom is known as disclosed in Patent Document 6. In a cooling method of this method, it is devised that by directly placing the substrate on a cooled substrate supporting base, the substrate is rapidly cooled by heat transfer. As a method of cooling a substrate while the substrate is left in a heating chamber without being moved to a cooling chamber, as disclosed in Patent Document 7, a method is known in which a cooled gas is introduced into the heating chamber for cooling by using convection of a gas. In this method, an idea of improving cooling efficiency by inserting a shutter plate which shuts off residual heat from the radiation energy source between the radiation energy source and the substrate after the heating is finished is disclosed.

As a method of further improving cooling efficiency, as disclosed in Patent Document 8, a method of using a heat treatment device provided with a cooling source and a movable cooling plate fixed in the same space as the heating chamber is known. In the method disclosed in Patent Document 8, the movable cooling plate is arranged and cooled so as to be in contact with a cooling source while the substrate is heated. Then, after the heating of the substrate is finished, the movable cooling plate is separated from the cooling source and brought into contact with the substrate so that cooling is accomplished by heat transfer between the substrate and the movable cooling plate.

As another method of cooling the substrate in the same space as the heating chamber, Patent Document 9 discloses a method of indirectly cooling the substrate by bringing the movable cooling source into contact with the substrate supporting base incorporating a heating resistor body. Also, similar methods in which the substrate is heated or cooled by bringing the substrate supporting base into contact with a heat source or the cooling source are disclosed in Patent Documents 10 and 11.

In Patent Document 11, the substrate supporting base itself has heating and cooling functions and an electrostatic adsorption function for improving heating and cooling efficiency, and the substrate supporting base having the electrostatic adsorption function has a groove engraved on a face in contact with the back face of the substrate, and gas for promoting heat exchange is introduced into the groove.

As an example in which a heating source and a cooling source are provided separately in one vacuum chamber so as to directly heat and cool only the substrate, there is disclosed an example in Patent Document 12, in which a load lock chamber of a sputtering device is provided with a mechanism which heats with heating light from a lamp heater and a mechanism which brings the substrate into contact with the cooled substrate supporting base by electrostatic adsorption and cools it. In this example, since both mechanisms are provided in the load lock chamber, heating and cooling are not intended to be conducted continuously. However, by performing heating and cooling at evacuation and at ventilation of the load lock chamber, respectively, treatment time for sputtering film formation accompanying substrate heating is to be reduced.

An example in which a magnetic field is applied to the substrate arranged in the vacuum so as to process the substrate is disclosed in Patent Documents 13 to 15. The examples in Patent Documents 13 and 14 both relate to an apparatus which applies heat treatment to a plurality of substrates while applying the magnetic field in the vacuum, and it is devised that heat treatment can be performed in large quantity in a uniform magnetic field. However, they do not perform the film forming process and heating/cooling processing in a continuous vacuum. Also, the example in Patent Document 15 has an idea in which in an apparatus which performs sputtering film formation while applying a magnetic field to the substrate, a mechanism which rotates a magnet which generates a magnetic field parallel with the substrate face in synchronization with the rotation of the substrate is provided, so that the parallel magnetic field in one direction all the time with respect to the substrate can be applied.

Patent Documents 16 and 17 disclose a heat treatment apparatus provided with a heating mechanism which heats the substrate, a cooling mechanism which cools the substrate, and a moving mechanism which moves the substrate between a position close to or in contact with the heating mechanism and a position close to or in contact with the cooling mechanism in the same chamber.

In Patent Document 16, a substrate supporting body incorporating a heater is used as a heating mechanism and a cooling plate of a water-cooling type or a refrigerant cooling type is used as a cooling mechanism. If the substrate is to be heated by the heating mechanism, the substrate is heated by bringing the substrate into contact with the substrate supporting body heated by the heater. In another example relating to the substrate heating, the substrate and the substrate supporting body are separated in arrangement, and the substrate is heated by allowing heated dry gas such as nitrogen to flow between the substrate and the substrate supporting body. On the other hand, if the substrate is to be cooled, the cooling plate is cooled by a cooling fluid, and the substrate is cooled by bringing the substrate into contact with or close to the cooled cooling plate.

In Patent Document 17, a heating plate and a cooling plate are provided, and when the substrate is to be heated or cooled, the heating plate or the cooling plate is separated from the substrate by a predetermined interval.

PRIOR-ART REFERENCES

Patent Document

[Patent Document 1] Japanese Patent Application Publication laid-open No. 2006-080116
[Patent Document 2] U.S. Pat. No. 6,841,395
[Patent Document 3] Japanese Patent Application Publication laid-open No. 2007-142424
[Patent Document 4] Japanese Patent Application Publication laid-open No. 2007-173843
[Patent Document 5] Japanese Patent Application Publication laid-open No. H6-13324
[Patent Document 6] Japanese Patent Application Publication laid-open No. H5-251377
[Patent Document 7] Japanese Patent No. 2886101
[Patent Document 8] Japanese Patent No. 3660254
[Patent Document 9] Japanese Patent Application Publication laid-open (translation of PCT application) No. 2002-541428
[Patent Document 10] Japanese Patent Application Publication laid-open No. 2003-318076
[Patent Document 11] Japanese Patent Application Publication laid-open No. 2002-76105
[Patent Document 12] Japanese Patent Application Publication laid-open No. 2003-13215
[Patent Document 13] Japanese Patent Application Publication laid-open No. 2001-102211
[Patent Document 14] Japanese Patent No. 3862660
[Patent Document 15] Japanese Patent Application Publication laid-open No. 2002-53956
[Patent Document 16] Japanese Patent Application Publication laid-open No. 2001-196363
[Patent Document 17] Japanese Patent Application Publication laid-open No. H7-254545

Non-Patent Document

[Non-Patent Document 1] Tsunekawa et al., "Film formation of magnetic tunnel junction in semiconductor manufacture line and fine work process" Magune, Vol. 2, No. 7, p. 358 to p. 363 (2007)
[Non-Patent Document 2] S. Isogami et al., "In situ heat treatment of ultrathin MgO layer for giant magnetoresistance ratio with low resistance area product in CoFeB/MgO/CoFeB magnetic tunnel junctions" Applied Physics Letters, 93, 192109 (2008)

SUMMARY OF INVENTION

In a magnetoresistance element functioning in an interface of a laminated film, device performance largely depends on impurities (mainly residual gas) adsorbed on the film surface when film has not been formed. The amount of the residual gas incident to the film surface in vacuum is generally in proportion with a product PT of a pressure P indicating the vacuum degree and time T during which the film surface is exposed to the vacuum atmosphere, and thus, the pressure of the atmosphere during heating, cooling and transfer of the substrate and time required for each process need to be made small, respectively.

In the prior-art methods in which the substrate is transferred to another chamber for cooling, there is a problem in which time required for transfer is lost, that is, the exposure time T becomes large. The method of cooling the substrate by introducing cooling gas into the heating chamber has a problem in which the vacuum degree gets poor, that is, the pressure P is raised. In the method of heating and cooling the substrate supporting base itself, there is a problem in which temperature rise and temperature drop speeds become slow for the heat capacity of the substrate supporting base, and particularly when the substrate temperature is to be lowered approximately to a room temperature, it takes a long time and also increases the exposure time T.

In the prior-art method of performing either of heating or cooling processes in the load lock chamber, to conduct the heating or cooling process of a thin film rapidly and continuously is impossible. Even if the substrate is returned to the load lock chamber after film formation and the heating/cooling process is conducted continuously, film formation cannot be performed subsequently due to an operation sequence of the apparatus. Also, there is a problem that the PT product is extraordinarily high, since the load lock chamber which is vented to the atmospheric pressure at each processing has a low vacuum degree, that is, high pressure P.

In an apparatus which conducts heating treatment for a large quantity of the substrates in the magnetic field, the substrates to which the film formation treatment has been applied in another film forming apparatus are taken out into the atmosphere once and put into an apparatus for heating in the magnetic field again to perform heating treatment, and thus, the film forming process and the heating/cooling process cannot be conducted in a continuous vacuum. In the apparatus which applies the magnetic field during film formation, too, the heating/cooling function is not provided, and the heating/cooling processing in a continuous vacuum after the film formation is not possible.

Also, as in Patent Documents 16 and 17, even the mode in which the heating mechanism and the cooling mechanism are provided in the same chamber, considering the heating treatment in a continuous vacuum, has the following problems. For example, in the invention disclosed in Patent Documents 16 and 17, if the substrate is to be heated by heating the substrate supporting body or the heating plate, temperature rise takes time due to the heat capacity of the substrate supporting body or the heating plate, and the product PT becomes large.

Also, in Patent Document 16, if the substrate is not heated by heating of the substrate supporting body itself but the substrate supporting body and the substrate are separated, and the heated gas is supplied between the substrate supporting body and the substrate to heat the substrate, the substrate can be heated regardless of the heat capacity of the substrate supporting body. However, the pressure P is increased by quantity of the gas supplied for heating, and as a result, the product PT is increased.

The present invention was made in view of the above prior-art problems and has an object to provide a vacuum heating/cooling apparatus and a manufacturing method of a magnetoresistance element which can rapidly heat and rapidly cool only a substrate while a high vacuum degree is maintained after film formation treatment.

In order to achieve the object, the present invention is a vacuum heating/cooling apparatus which heats/cools a substrate in vacuum, the apparatus including: a vacuum chamber; a radiation energy source which is arranged on the atmosphere side of the vacuum chamber and radiates heating light; an incident portion for causing the heating light from the radiation energy source to enter the vacuum chamber; a member arranged inside the vacuum chamber and having a cooling mechanism, the member being coolable by the cooling mechanism; and a substrate moving mechanism which has a substrate holding part for holding the substrate, causes the substrate holding part to stand still at a heating position and a cooling position, which is a position different from the heating position, and also moves the substrate holding part between the heating position and the cooling position, wherein the heating position is a position where the substrate should be located when being heated and is a position close to the radiation energy source, and the cooling position is a position where the substrate should be located when being cooled and is a position close to the member or where the substrate is placed on the member.

Also, the present invention is a manufacturing method of a magnetoresistance element including a three-layer structure having at least a magnetization fixing layer, a tunnel barrier layer or non-magnetic conductive layer, and a magnetization free layer, the method including: a step of preparing a substrate in which the tunnel barrier layer or non-magnetic conductive layer is formed; a heating step of heating the substrate with heating light incident from outside of a vacuum chamber in which the substrate is mounted; and a cooling step of cooling the heated substrate at a position different from the position where heating with the heating light is performed in the vacuum chamber.

Moreover, the present invention is a manufacturing method of a magnetoresistance element including a three-layer structure having at least a first magnetic layer, a tunnel barrier layer or non-magnetic conductive layer, and a second magnetic layer, the method including: a step of forming the first magnetic layer and the tunnel barrier layer or non-magnetic conductive layer on the substrate; a step of arranging the substrate on which the first magnetic layer and the tunnel barrier layer or non-magnetic conductive layer are formed at a predetermined position; a heating step of heating the substrate by irradiating the substrate on which the first magnetic layer and the tunnel barrier layer or non-magnetic conductive layer are formed with heating light introduced into the vacuum chamber from outside of the vacuum chamber in which the substrate on which the first magnetic layer and the tunnel barrier layer or non-magnetic conductive layer are formed is arranged; and a cooling step of cooling the heated substrate at a position different from the predetermined position in the vacuum chamber, wherein the tunnel barrier layer or non-magnetic conductive layer is a MgO layer; and in at least one of the heating step and the cooling step, a magnetic field is applied so as to align the magnetization direction of the first magnetic layer.

According to the present invention, even after the film formation processing, only the substrate can be rapidly heated or rapidly cooled while a high vacuum degree is maintained.

DESCRIPTION OF EMBODIMENTS

Figure 1:
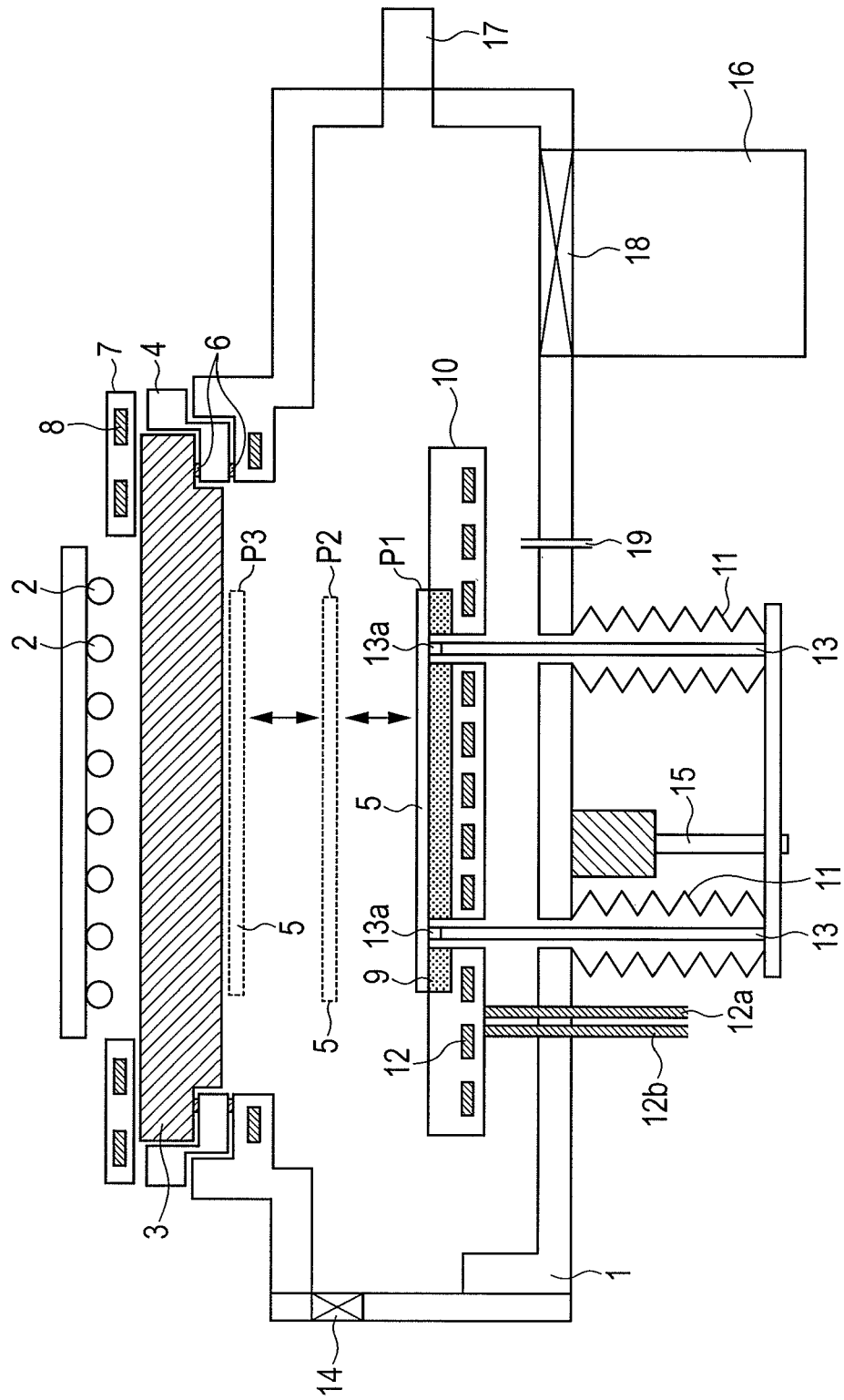
FIG. 1 is a configuration diagram of a vacuum heating/cooling apparatus according to an embodiment of the present invention.

An embodiment of the present invention will be described below in detail by referring to the attached drawings. In the drawings described below, those having the same function are given the same reference numerals, and repeated description will be omitted.

First Embodiment

FIG. 1 is an apparatus configuration diagram of a vacuum heating/cooling apparatus according to this embodiment.

In FIG. 1, on an upper part of a vacuum chamber 1, a quartz window 3 which transmits heating light from a halogen lamp 2 is fixed through a vacuum seal member (not shown). This quartz window 3 functions as an incident portion for causing the heating light output from the halogen lamp 2 to enter the vacuum chamber 1. The vacuum seal member preferably has high heat resistance such as Viton (registered trademark) or Kalrez (registered trademark). By providing a ring 4 for attaching/detaching the quartz window between the vacuum chamber 1 and the quartz window 3 as illustrated in FIG. 1, attachment/detachment of the quartz window 3 is facilitated. The size of the quartz window 3 is preferably 1.5 times or more the size of a substrate 5. Also, the halogen lamp 2 as a radiation energy source which radiates the heating light is arranged on the atmosphere side. That is, the halogen lamp 2 is arranged outside the vacuum chamber 1 so as to irradiate the quartz window 3 with the heating light. As the radiation energy source, it is not limited to the halogen lamp as long as it radiates the heating light such as infrared rays, for example. A ring-shaped shield plate 7 is provided between the halogen lamp 2 and the quartz window 3 so that the heating light from the halogen lamp 3 does not directly irradiate an O-ring 6. The shield plate 7 is made of aluminum with good heat conductivity and has a structure to be cooled by cooling water by providing a cooling water path 8.

Inside the vacuum chamber 1 below the halogen lamp 2, a substrate supporting base 9 having the substantially same diameter as that of a substrate 5 is arranged. Also, a water-cooling jacket 10 is arranged in contact with the substrate supporting base 9. That is, in this embodiment, a member having a cooling mechanism includes the substrate supporting base 9 and the water-cooling jacket 10 in contact with the substrate supporting base 9. As the substrate supporting base 9, a dielectric material with high heat conductivity is preferably used, and AlN (aluminum nitride) is used in this embodiment. The water-cooling jacket 10 preferably has the size that can receive the heating light from the halogen lamp 2 as widely as possible and such that the heating light from the halogen lamp 2 does not directly irradiate the inner wall of the vacuum chamber 1. For the water-cooling jacket 10 incorporating a cooling water path 12 which becomes a channel of the cooling water as a refrigerant, a material with low gas emission rate and high heat conductivity is preferably used, and aluminum is used in this embodiment.

Also, to the cooling water path 12, a cooling water inlet 12a and a cooling water outlet 12b are connected, and to the cooling water inlet 12a, a pump (not shown) is connected. Thus, by driving the pump, cooling water is introduced through the cooling water inlet 12a into the cooling water path 12 and passes through the cooling water path 12 incorporated in the cooling jacket 10 so as to cool the cooling jacket 10 and is discharged through the cooling water outlet 12b. When the cooling jacket 10 is cooled by the cooling water, the cooling effect reaches the substrate supporting base 9, and if the substrate 5 is placed on the substrate supporting base 9, the placed substrate 5 can be cooled.

In this embodiment, the mode in which the water-cooling jacket 10 having the cooling water path 12 and the substrate supporting base 9 are in contact with each other is used, but the cooling water path 12 may be built in the substrate supporting base 9. That is, in the present invention, it is important that the substrate supporting base 9 has the cooling function and thus, the substrate supporting base 9 is in contact with the cooling mechanism (such as the water-cooling jacket 10, the cooling water path 12 and the like) for causing the refrigerant to flow or incorporates the cooling mechanism.

In the substrate supporting base 9 and the water-cooling jacket 10, through holes are opened at least at three spots on the outer periphery part in a range of the size of the substrate 5, respectively, and lift pins 13 which vertically move the substrate 5 are inserted into the through holes. The lift pins 13 are connected to a vertical driving mechanism 15 located on the atmosphere side through a bellows 11 and vertically elevated by driving of the vertical driving mechanism 15. As the vertical driving mechanism 15, a motor driving type or an air cylinder type using compressed air may be used. The vertical driving mechanism 15 is connected to a control part (not shown in FIG. 1), which will be described later, and by means of control of the driving of the vertical driving mechanism 15 by the control part, (vertical) elevation of the lift pins 13 is controlled.

In this embodiment, by supporting the lower face (the face opposite to the face to be processed) of the substrate 5 with distal ends 13a of the at least three lift pins 13, the substrate 5 is held by the lift pins 13. That is, the substrate 5 is held by the distal ends 13a of the lift pins 13, and thus, the distal end 13a of each lift pin 13 functions as the substrate holding part, respectively. The substrate 5 held by the lift pins 13 can stand still (be stopped) at a cooling position P1, a transfer position P2, and a heating position P3 by means of the control of the vertical driving mechanism 15 by the control part and also can move between the cooling position P1 and the heating position P3. In FIG. 1, the substrate 5 standing still at the transfer position P2 and the heating position P3 is indicated by broken lines for convenience.

In this description, the "cooling position" is a position where the substrate should be arranged when the substrate is to be cooled and in this embodiment, the position where the substrate 5 is placed on the substrate supporting base 9 is referred to as the cooling position P1. The cooling position is not limited to the position where the substrate is placed on the substrate supporting base but may be a position close to the substrate supporting base as long as it is within a range where the cooling effect generated from the substrate supporting base having the cooling function can act.

Also, the "heating position" is a position different from the cooling position and where the substrate should be arranged when the substrate is to be heated and a position between the radiation energy source and the substrate supporting base having the cooling function and set at a position closer to the radiation energy source than the cooling position P1. In this embodiment, the heating position P3 is set close to the quartz window 3.

Moreover, the "transfer position" is a position where the substrate transferred from the outside is first held and set between the cooling position P1 and the heating position P3. In this embodiment, the transfer position P2 is set in a space facing the opening of a gate valve 14 for transferring the substrate and a space within a range of the width of the opening. The substrate 5 transferred from the outside is held by the distal ends of the lift pins 13 at the transfer position P3 and then, moved to the heating position P3 or the cooling position P1 by elevation of the lift pins 13. The transfer position P3 is preferably set in the above space but may be set at a position outside the space. That is because, in the present invention, it is important to perform rapid heating and rapid cooling in a continuous vacuum. For that purpose, it is essential that the heating position P3 and the cooling position P1 are separately provided in the same vacuum chamber and the heating processing is performed at the heating position P3 and the cooling processing is performed at the cooling position P1. Thus, as long as the essential requirements are realized, the transfer position can be anywhere.

On the side face of the vacuum chamber 1, the gate valve 14 for transferring the substrate is arranged, so that the substrate 5 can be taken out/taken in while the vacuum is maintained with the other adjacent vacuum chambers. On the side opposite the gate valve 14 for transferring the substrate in the vacuum chamber 1, a vacuum pump 16 for vacuum evacuation is arranged through a gate valve 18 for vacuum sealing.

The vacuum chamber 1 is made of aluminum or stainless with low gas emission rate, and on the atmosphere side of the chamber, a sheath heater for baking (not shown) and a cooling water pipeline for cooling (not shown) are wound. If the vacuum chamber 1 is evacuated from the atmosphere, the sheath heater is energized to heat the vacuum chamber 1 to 150° C. or more and to perform baking for at least 2 hours or more to promote gas release from the chamber inner wall. When the chamber baking is finished, water is made to flow through the cooling water pipeline so as to cool the chamber to a room temperature. When the vacuum degree in the vacuum chamber 1 is saturated, preparation is completed, but the cooling water is continuously made to flow in order to prevent the vacuum chamber 1 from being warmed during the heating process. Also, a vacuum meter 17 and a gas inlet 19 are installed at least at one spot in the vacuum chamber 1, respectively.

Figure 3:
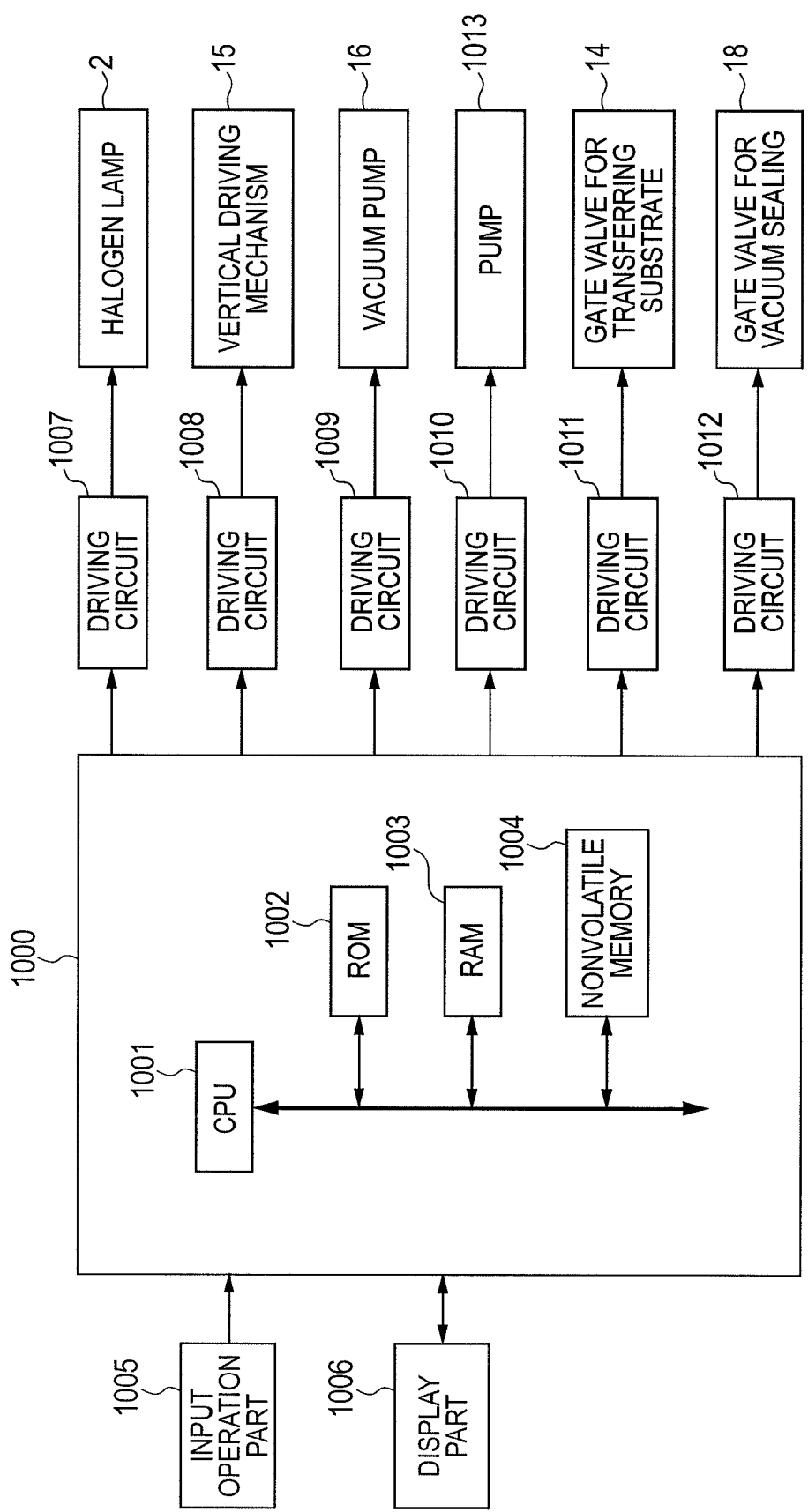
FIG. 3 is a block diagram illustrating an outline configuration of a control system in the vacuum heating/cooling apparatus according to the present invention.

FIG. 3 is a block diagram illustrating an outline configuration of a control system in the vacuum heating/cooling apparatus of this embodiment.

In FIG. 3, reference numeral 1000 denotes a control part as control means which controls the entire vacuum heating/cooling apparatus. This control part 1000 has a CPU 1001 which executes a processing operation such as various calculations, control, discrimination and the like and a ROM 1002 which stores various control programs executed by this CPU 1001. Also, the control part 1000 has a RAM 1003 which temporarily stores data during the processing operation of the CPU 1001, input data and the like and a nonvolatile memory 1004 such as a flash memory, SRAM and the like.

Also, to this control part 1000, an input operation part 1005 including a keyboard for inputting a predetermined instruction or data and the like or various switches and a display part 1006 which makes various displays including input/setting states of the vacuum heating/cooling apparatus are connected. Also, to the control part 1000, the halogen lamp 2, the vertical driving mechanism 15, the vacuum pump 16, a pump 1013 for introducing cooling water, the gate valve 14 for transferring the substrate, and the gate valve 18 for vacuum sealing are connected through driving circuits 1007, 1008, 1009, 1010, 1011 and 1012, respectively.

In accordance with an instruction from the CPU 1001, the halogen lamp 2 radiates radiation light, and the vertical driving mechanism 15 vertically moves the lift pins 13. The pump 1013 is connected to the cooling water inlet 12a and introduces cooling water into the cooling water inlet 12a in accordance with the instruction from the CPU 1001. Also, in accordance with the instruction from the CPU 1001, the gate valve 18 for vacuum sealing and the vacuum pump 16 are driven so as to evacuate the vacuum chamber 1. Moreover, in accordance with the instruction from the CPU 1001, opening/closing of the gate valve 14 for transferring the substrate is controlled so that the substrate 5 can be transferred into the vacuum chamber 1.

Subsequently, an operation of this embodiment will be described by using the attached drawings.

Figure 2:
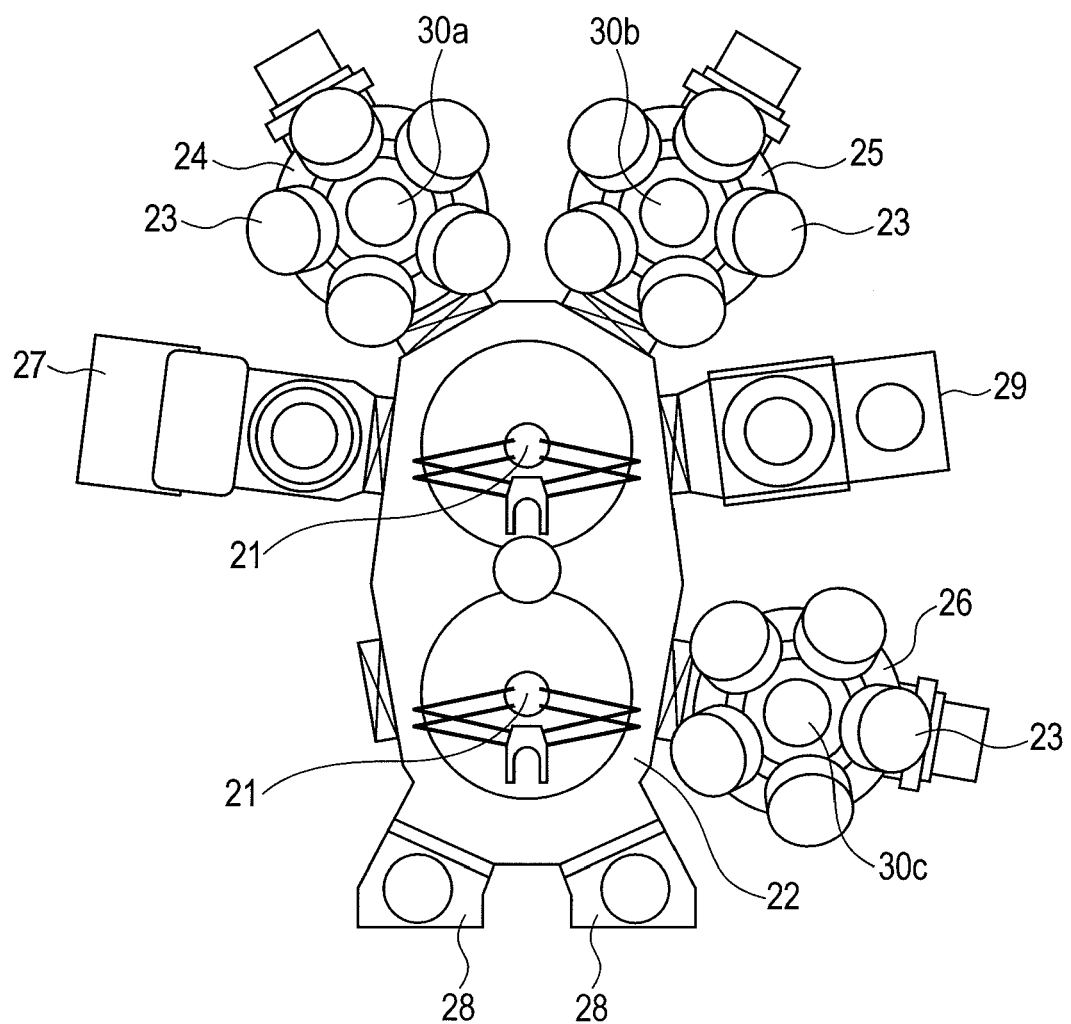
FIG. 2 is a configuration diagram of a sputtering apparatus to which the vacuum heating/cooling apparatus according to the embodiment of the present invention is connected.

FIG. 2 illustrates a chamber configuration of a sputtering apparatus to which the vacuum heating/cooling apparatus according to this embodiment is connected. The sputtering device illustrated in FIG. 2 is a manufacturing apparatus capable of forming a magnetoresistance element including a three-layer structure having at least a magnetization fixing layer, a tunnel barrier layer or a non-magnetic conductive layer, and a magnetization free layer and a semiconductor element in a continuous vacuum.

The sputtering apparatus illustrated in FIG. 2 includes a vacuum transfer chamber 22 provided with two vacuum transfer mechanisms (robots) 21. To the vacuum transfer chamber 22, three sputter film-forming chambers 24, 25 and 26 on which a plurality of sputtering cathodes 23 is mounted, an etching chamber 27 for cleaning the surface of the substrate, a load lock chamber 28 for taking out/taking in the substrate between the atmosphere and the vacuum, and a vacuum heating/cooling apparatus 29 according to this embodiment described in FIG. 1 are connected through the gate valves, respectively. Therefore, movement of the substrate between each chamber can be made without breaking the vacuum. In each of the sputter film-forming chambers 24 to 26, substrate holders 30a to 30c are disposed. In the vacuum transfer chamber 22, an oxidation treatment chamber may be provided.

In this embodiment, in the sputter film-forming chamber 24, Ta, Ru, IrMn, CoFe, CoFeB targets are mounted, at least MgO target is mounted in the sputter film-forming chamber 25, and at least CoFeB and Ta targets are mounted in the sputter film-forming chamber 26. By means of the vacuum transfer mechanism 21, a Si substrate is introduced into the vacuum through the load lock chamber 28, and first, impurities adhering onto the Si substrate are removed in the etching chamber 27. After that, the Si substrate is transferred by the vacuum transfer mechanism 21 to the sputter film-forming chamber 24, and in the sputter film-forming chamber 24, a laminated body of Ta (5 nm)/Ru (2 nm)/IrMn (5 nm)/CoFe (2.5 nm)/Ru (0.85 nm)/CoFeB (3 nm) film is formed on the Si substrate. Subsequently, by means of the vacuum transfer mechanism 21, the Si substrate is transferred from the sputter film-forming chamber 24 to the sputter film-forming chamber 25, and in the sputter film-forming chamber 25, approximately 1 nm of an MgO film is formed on the laminated body so as to have a structure of a Si substrate/Ta (5 nm)/Ru (2 nm)/IrMn (5 nm)/CoFe (2.5 nm)/Ru (0.85 nm)/CoFeB (3 nm)/MgO (1 nm). After that, by means of the vacuum transfer mechanism 21, the Si substrate is transferred from the sputter film-forming chamber 25 to the vacuum heating/cooling apparatus 29, and the vacuum heating/cooling apparatus 29 transfers the transferred Si substrate (substrate 5) and performs heating/cooling treatment. Finally, by means of the vacuum transfer mechanism 21, the Si substrate is transferred from the vacuum heating/cooling apparatus 29 to the sputter film-forming chamber 26, and in the sputter film-forming chamber 26, CoFeB (3 nm)/Ta (5 nm) is laminated on the laminated body formed on the transferred Si substrate so as to complete a tunnel magnetoresistance element.

Subsequently, treatment contents in the vacuum heating/cooling apparatus 29 according to this embodiment illustrated in FIG. 1 will be described in detail.

Upon receipt of an instruction of the heating/cooling treatment, the control part 1000 executes control so as to open the gate valve 14 for transferring the substrate. At this time, the substrate (Si substrate) 5 in which up to the MgO film has been formed in the sputter film-forming chamber 25 is transferred by the substrate transfer mechanism 21 of the vacuum transfer chamber 22 onto the lift pins 13 waiting at the transfer position P2 in the vacuum heating/cooling apparatus 29. After that, by means of control of the control part 1000, the gate valve 14 is closed, and the lift pins 13 are raised. At this time, the control part 1000 controls the vertical driving mechanism 15 and raises the lift pins 13 so that the substrate 5 held by the lift pins 13 is located at the heating position P3. At this time, the heating position 3 is preferably set so that the distance between the halogen lamp 2 and the substrate 5 is 100 mm or less. In this state, in accordance with the instruction from the control part 1000, power is input into the halogen lamp 2, and the substrate 5 is irradiated with heating light through the quartz window 3 from the atmosphere side. When the temperature of the substrate 5 reaches a desired temperature, the control part 1000 lowers the input power of the halogen lamp 2 and executes control such that the substrate temperature maintains a certain value. The heating treatment of the substrate is performed as above.

In this embodiment, at predetermined timing before the heating treatment is finished, a cooling operation of the substrate supporting base 9 is started. In the cooling operation, the control part 1000 executes control of driving the pump 1013. By means of this control, the cooling water is introduced from the pump 1013 into the cooling water inlet 12a and is discharged from the cooling water outlet 12b through the cooling water path 12. At this time, the substrate supporting base 9 is cooled by the cooling water passing through the cooling water path 12.

After a desired time has elapsed, the control part 1000 executes control of stopping power supply to the halogen lamp 2. Then, the control part 1000 controls the vertical driving mechanism 15 so as to lower the lift pins 13 which support the substrate 5 having been subjected to the heating treatment and positions the substrate 5 at the cooling position P1. That is, the substrate 5 is placed on the substrate supporting base 9 (cooling position P1) cooled by the cooling water for cooling the substrate 5. When the temperature of the substrate 5 is cooled to an approximately room temperature, the control part 1000 controls the vertical driving mechanism 15 so as to raise the lift pins 13 to the transfer position P2, opens the gate valve 14, and carries out the substrate 5 on the lift pins 13 by the substrate transfer mechanism 21.

As described above, the control part 1000 controls driving of the lift pins 13 so that the substrate 5 is positioned at the heating position P3 in the heating treatment and stops the substrate 5 at the heating position P3 to perform the heating treatment. Then, the control part 1000 can execute control such that the cooling water flows through the cooling water path 12 during the heating treatment or from the stage before the heating treatment. Therefore, at the time when the heating treatment has finished, the substrate supporting base 9 has entered the sufficiently cooled state. Subsequently, the control part 1000 controls driving of the lift pins 13 so as to position the substrate 5 at the cooling position P1 in the cooling treatment and stop the substrate 5 at the cooling position P1 for the cooling treatment.

As described above, in this embodiment, by heating only the substrate 5 by the heating light in the state in which the vacuum chamber 1 and the substrate supporting base 9 in the vacuum chamber 1 are cooled all the time, heating and cooling of the substrate can be rapidly accomplished while high vacuum is maintained.

That is, in this embodiment, when the substrate 5 is to be heated, it is performed not by using the configuration in which the substrate supporting base 9 itself is heated but by holding and heating the substrate 5 at the heating position P3 separated from the substrate supporting base 9 having the cooling function, and thus, the substrate 5 can be heated regardless of the heat capacity of the substrate supporting base 9. Therefore, time required for the heating of the substrate can be reduced, and the substrate can be rapidly heated. That is, since the halogen lamp 2 which radiates the heating light is disposed outside the vacuum chamber 1 and the substrate is heated by the heating light from the halogen lamp 2, the substrate can be heated without heating the substrate supporting body itself or the heating plate itself included in the heating mechanism as in Patent Documents 16 and 17. Thus, in the mode in which the heating mechanism and the cooling mechanism are provided in the same chamber, this embodiment does not have a configuration of heating the substrate by heating a predetermined member and by transmitting heat of the member to the substrate, time required for heating can be reduced, and a time element "T" in the product PT which is an index of a remaining gas can be reduced.

Also, in another example in Patent Document 16, the substrate and the substrate supporting body are separated as described above, and a heated dry gas is introduced into a separation region between the substrate and the substrate supporting body so as to heat the substrate with heat of the dry gas. According to this configuration, since the substrate supporting body itself is not heated, time for heating the substrate supporting body itself can be omitted, and the time element "T" in the product PT can be reduced.

However, in this configuration, the dry gas for heating the substrate needs to be supplied, and the pressure is increased by the portion for this supplied dry gas. Therefore, even if the time element "T" in the product PT can be decreased, a pressure element "P" is increased, and the product PT cannot be reduced well. Thus, even if the pressure in the chamber is lowered in order to reduce the product PT, the pressure is increased by the portion for the supply of gas for heating, and the heating treatment while the high vacuum degree is maintained is difficult.

On the other hand, in this embodiment, using the idea that the substrate is heated by the heating light, the halogen lamp 2 is provided on the atmosphere side (outside) of the vacuum chamber 1, the heating light emitted from the halogen lamp 2 is made to enter the vacuum chamber 1 through the quartz window 3, and the substrate to be heated is irradiated with the incident heating light. That is, in this embodiment, since the substrate is heated by the heating light such as infrared rays, the substrate can be heated without using an element resulting in the pressure increase such as the heated dry gas. Therefore, the substrate can be heated without increasing the pressure element "P" of the product PT. Thus, by lowering the pressure in the vacuum chamber 1, the pressure element is also lowered, and the heating treatment can be conducted at the high vacuum degree.

Also, since the heating position P3 and the cooling position P1 are disposed at separate positions in the same vacuum chamber 1, it is possible to cool the substrate supporting base 9 while the heating treatment is conducted at the heating position P3 or from the stage before the heating treatment.

Thus, in a stage when the heating treatment of the substrate is finished and the processing proceeds to cooling of the substrate, the substrate supporting base 9 can be sufficiently cooled, and when the substrate 5 is placed on the substrate supporting base 9 or arranged close thereto (that is, when the substrate is arranged at the cooling position P1), the cooling action of the substrate supporting base 9 can be made to affect the substrate 5 immediately. Therefore, rapid cooling can be realized.

Moreover, in this embodiment, the substrate 5 is supported by the lift pins 13 and moved between the heating position P3 and the cooling position P1. Therefore, since the substrate 5 can be supported not on a plane but by a point, the effect of the heat capacity of a member (lift pins 13) which supports the substrate 5 in the heating treatment can be reduced. Therefore, if the cooling treatment is conducted after the heating treatment, since a contact region between the lift pins 13 and the substrate 5 is small, the effect of the heat capacity of the lift pins 13 is reduced. Therefore, time required for temperature drop of the substrate 5 can be reduced, and rapid cooling can be realized. Also, in the heating treatment, too, the effect of the heat capacity of the lift pins 13 on heating of the substrate 5 can be reduced, and thus, rapid heating can be realized.

As described above, in this embodiment, the cooling position P1 and the heating position P3 are provided separately in the vacuum chamber 1, and moreover, the heating treatment of the substrate is conducted by causing the heating light to enter the substrate. Therefore, in the same chamber, while the high vacuum degree is maintained, preparation for the heating treatment of the substrate and preparation for the cooling treatment of the substrate can be made simultaneously and independently. Thus, both the pressure element "P" and the time element "T" of the product PT can be reduced with efficiency.

Figure 11:
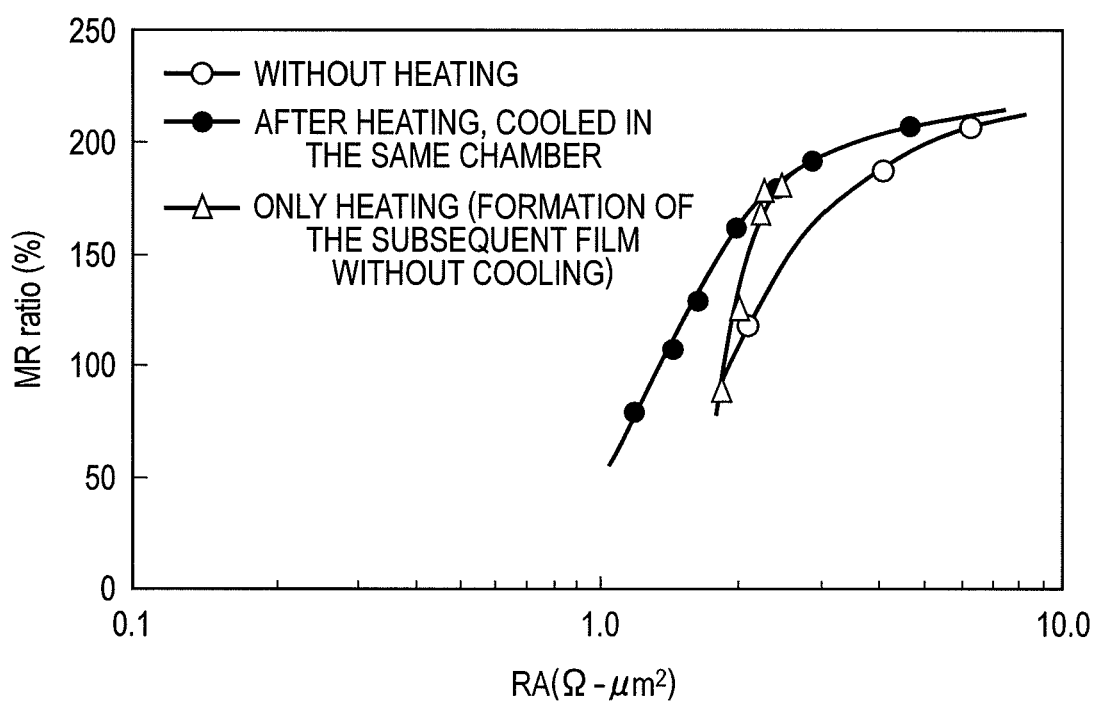
FIG. 11 is a diagram illustrating an MR-RA curve of a tunnel magnetic resistance element according to the embodiment of the present invention.

FIG. 11 is a diagram illustrating an MR-RA curve of a case in which the subsequent layers are formed without heating after an MgO film is formed, a case in which heating is conducted after the MgO film is formed and then, cooling is conducted in the same chamber and the subsequent layers are formed (this embodiment), and a case in which heating is conducted after the MgO film is formed but the subsequent layers are formed without cooling, in the above-described film formation of the tunnel magnetoresistance element.

If the tunnel magnetoresistance element is to be used as a sensor of a magnetic head, it is preferable to obtain a higher MR ratio in a lower RA region. As illustrated in FIG. 11, if heating is not conducted after the MgO film is formed, the MR ratio rapidly falls where RA is around 6 to 7 $\Omega\mu m^2$. On the other hand, as illustrated in FIG. 11, if heating is conducted after the MgO film is formed, though the phenomenon in which the MR ratio deteriorates as RA falls remains the same, the drop rate of the MR ratio is gentler than the case in which heating is not conducted after the MgO film is formed, and the high MR ratio is kept. Moreover, if cooling is not conducted after heating, the MR ratio rapidly falls from around 2 $\Omega\mu m^2$, but by conducting cooling after heating, the drop rate of the MR ratio can be suppressed.

As described above, according to this embodiment, when the MgO film of the tunnel magnetoresistance element is to be manufactured, by heating the formed MgO film by the heating light at the heating position P3 and also by cooling it in the same chamber at the cooling position P1 different from the heating position P3, the product PT can be made small, and moreover, a higher MR ratio can be realized at a lower RA, which is a special advantage.

As described above, in this embodiment, the heating treatment of the substrate and the cooling treatment of the substrate can be conducted in the same vacuum chamber, and also, both the time required for the heating treatment and the time required for the cooling treatment can be reduced. Therefore, both the pressure P indicating the vacuum degree and the exposure time T can be reduced, and the remaining gas incident to the film surface of the substrate can be reduced.

Second Embodiment

In the first embodiment, if the heating temperature is high or depending on the type of the substrate 5, when the substrate 5 is placed on the cooled substrate supporting base 9, the substrate might be split by thermal shock. In order to prevent such split of the substrate, in this embodiment, after the heating in the first embodiment is finished, the substrate 5 is not immediately placed on the substrate supporting base 9 when the lift pins 13 are lowered but the substrate is stopped once at a predetermined position above the substrate supporting base 9. Such a predetermined position is preferably within 20 mm above the substrate supporting base 9. Alternatively, during non-heating, the substrate 5 may be stopped once at a position where the distance between the halogen lamp 2 and the substrate 5 is 100 mm or more.

By configuring above, the substrate can be cooled while split is avoided. That is, in this embodiment, if the temperature of the substrate 5 has fallen to a temperature at which the substrate is not split even after being placed on the cooled substrate supporting base 9, the lift pins 13 are lowered to the cooling position and the substrate 5 is placed on the substrate supporting base 9, so that the substrate temperature can be rapidly cooled to the vicinity of the room temperature while split of the substrate 5 is avoided.

Third Embodiment

In the first and second embodiments, in order to further reduce time till the substrate temperature reaches the room temperature after the substrate 5 is placed on the cooled substrate supporting base 9, at least one of provision of an electrostatic adsorption mechanism such as an electrostatic chuck on the substrate supporting base 9 and supply of cooling gas to the surface of the substrate supporting base 9 is effective.

Figure 4:
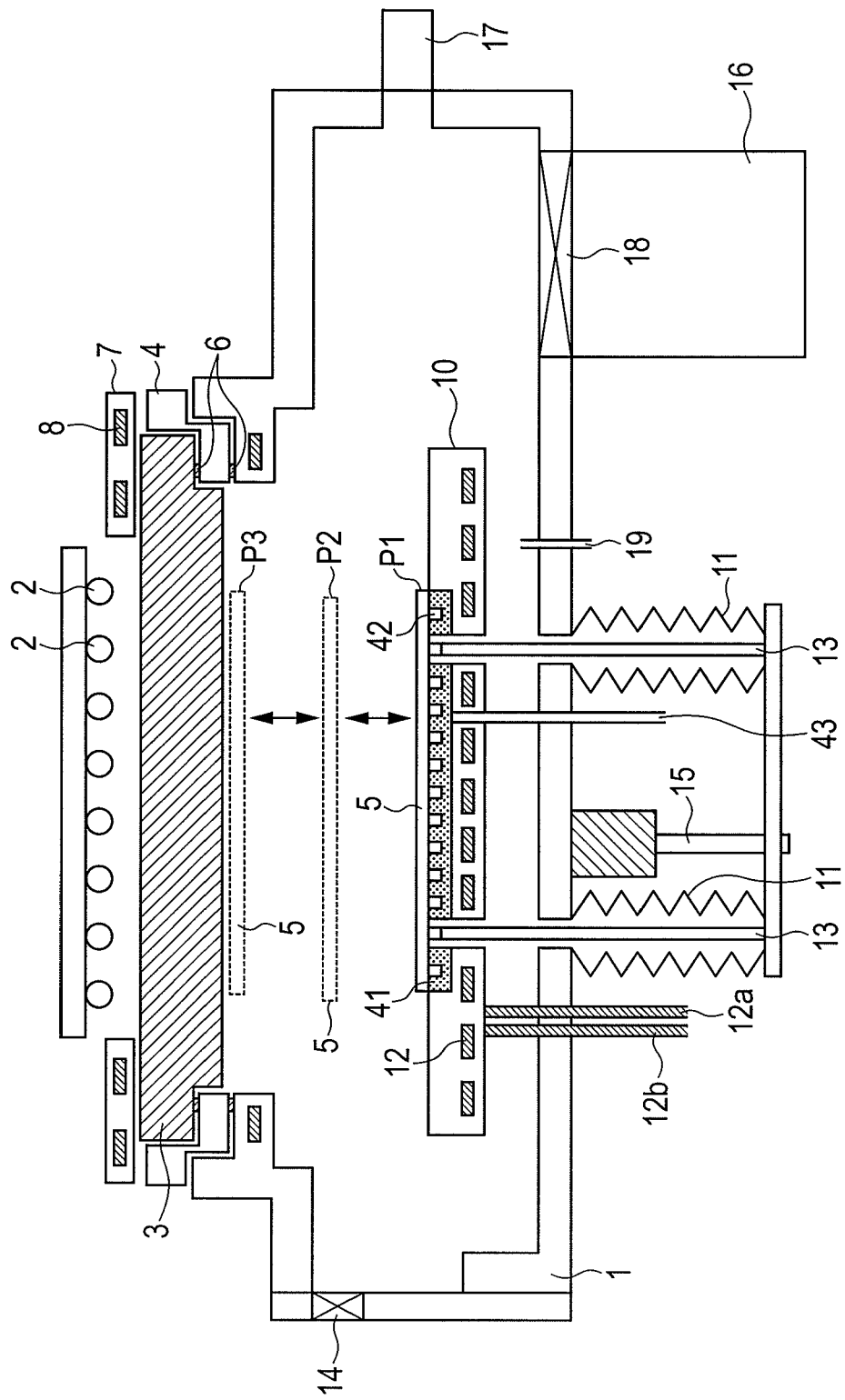
FIG. 4 is a configuration diagram of the vacuum heating/cooling apparatus according to the embodiment of the present invention.

FIG. 4 is a diagram for explaining a mode in which an electrostatic chuck function is provided in the substrate supporting base of the vacuum heating/cooling apparatus illustrated in FIG. 1.

In FIG. 4, a substrate supporting base 41 is one adding the electrostatic chuck function to the substrate supporting base 9 illustrated in FIG. 1 according to this embodiment. Specifically, the substrate supporting base 41 made of a dielectric body is in contact with or incorporates wiring (not shown) which introduces electricity (electric power), and the wiring is electrically connected to an external power supply. The external power supply is configured to apply a voltage to the wiring in accordance with an instruction from the control part 1000. Thus, if the voltage is applied to the wiring in accordance with the instruction of electrostatic adsorption from the control part 1000, the substrate can be adsorbed to the substrate supporting base 41 by static electricity generated by the voltage.

Also, a groove 42 is formed in a face in contact with the back face of the substrate 5 (the face on which the substrate 5 is placed) of the substrate supporting base 41, and at least a pair of gas introduction pipelines 43 which introduce and evacuate cooling gas into and from the atmosphere side are connected to the groove 42. The gas introduction pipelines 43 are connected to a gas introduction mechanism (not shown) which introduces and evacuates the cooling gas into and from the gas introduction pipelines 43, and the gas introduction mechanism introduces the cooling gas into the gas introduction pipelines 43 in accordance with an instruction from the control part 1000.

In this embodiment, in the first and second embodiments, after the lift pins 13 are lowered after the heating treatment is finished and the substrate 5 is placed on the substrate supporting base 41, the control part 1000 controls the external power supply so as to power on the electrostatic chuck mechanism (wiring) of the substrate supporting base 41 and brings the substrate 5 into close contact with the substrate supporting base 41 cooled by means of static electricity. Moreover, the control part 1000 controls the gas introduction mechanism so as to introduce Ar gas as the cooling gas into the groove 42 for cooling gas introduction engraved in the substrate supporting base 41, and the Ar gas is brought into direct contact with the back face of the substrate 5, so that cooling time to the room temperature can be drastically improved.

Figure 5:
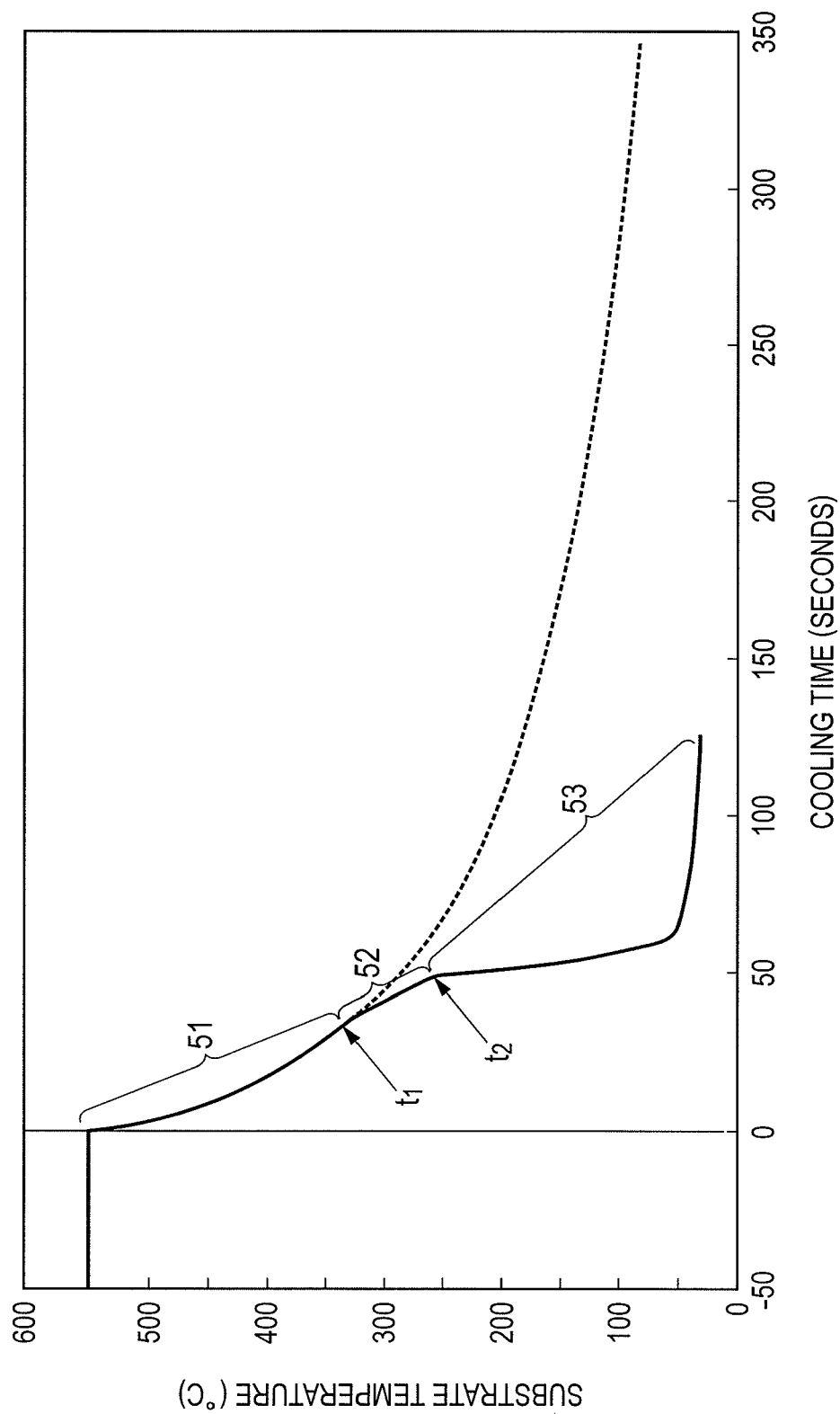
FIG. 5 is a temperature drop curve indicating the relationship between time and a substrate temperature when the substrate after heating treatment is cooled according to the embodiment of the present invention.

FIG. 5 is a comparison diagram of temperature falling curves of a case in which a Si wafer (substrate 5) having a diameter of 300 mm and heated to 550° C. is only placed on the cooled substrate supporting base 41 (only cooling by the cooling water path 12) and a case in which the substrate 5 is placed on the cooled substrate supporting base 41 and then, subjected to electrostatic chuck and moreover, Ar gas is made to flow on the back face of the substrate 5.

In FIG. 5, a broken line is the temperature falling curve of the case in which the substrate 5 is only placed on the substrate supporting base 41. A region with reference numeral 51 in a solid line is the temperature falling curve in a time zone when the electrostatic chuck and the Ar gas introduction are not performed in the case in which the substrate 5 is placed on the substrate supporting base 41 and both the electrostatic chuck and the Ar gas introduction are performed. Also, a region with reference numeral 52 in the solid line is the temperature falling curve in a time zone when the electrostatic chuck is turned on in the case in which both the electrostatic chuck and the Ar gas introduction are performed. Moreover, a region with reference numeral 53 in the solid line is the temperature falling curve in a time zone when the electrostatic chuck is turned on and moreover, the Ar gas is introduced in the case in which both the electrostatic chuck and the Ar gas introduction are performed.

In FIG. 5, by performing the electrostatic chuck at time t1, the cooling speed is increased, and moreover, by introducing the Ar gas as the cooling gas onto the back face of the substrate 5 at time t2, the cooling sped is further increased. As a result, it is known that after two minutes have elapsed since cooling was started, the substrate temperature reaches a room-temperature level of 40° C. or less.

Fourth Embodiment

Figure 6:
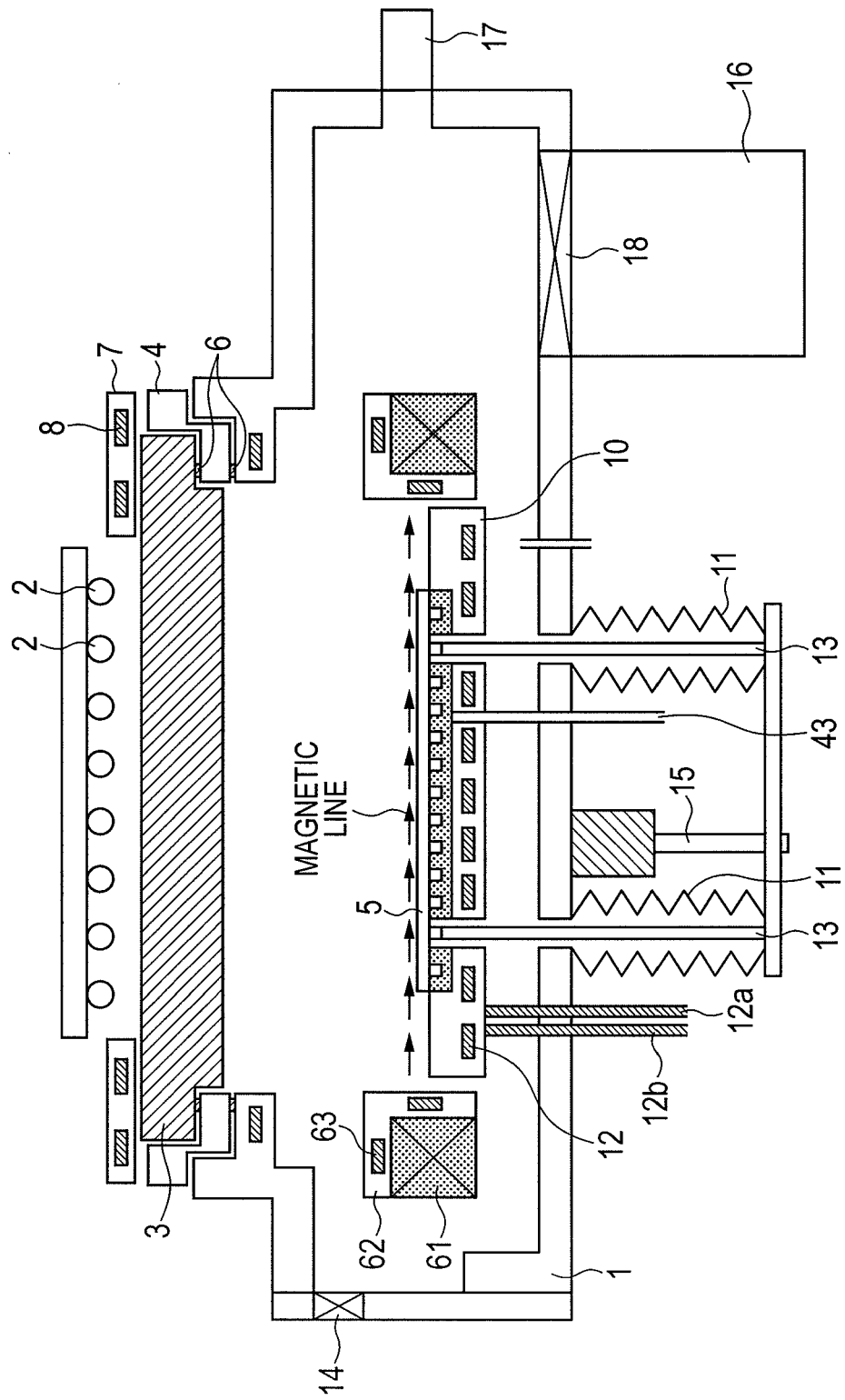
FIG. 6 is a configuration diagram of the vacuum heating/cooling apparatus according to the embodiment of the present invention.

In this embodiment, as illustrated in FIG. 6, a magnet 61 as a magnetic-field application mechanism is arranged outside the water-cooling jacket 10 for cooling the substrate supporting base 41. Moreover, in order to prevent temperature rise by direct incidence of the heating light to the magnet 61, a reflector 62 is provided so as to surround the magnet 61. At this time, in order to prevent temperature rise of the reflector 62, the reflector 62 itself preferably has a water-cooling jacket structure in which a cooling water pipeline 63 is incorporated so that the reflector 62 is brought into contact with the refrigerant.

Figure 7:
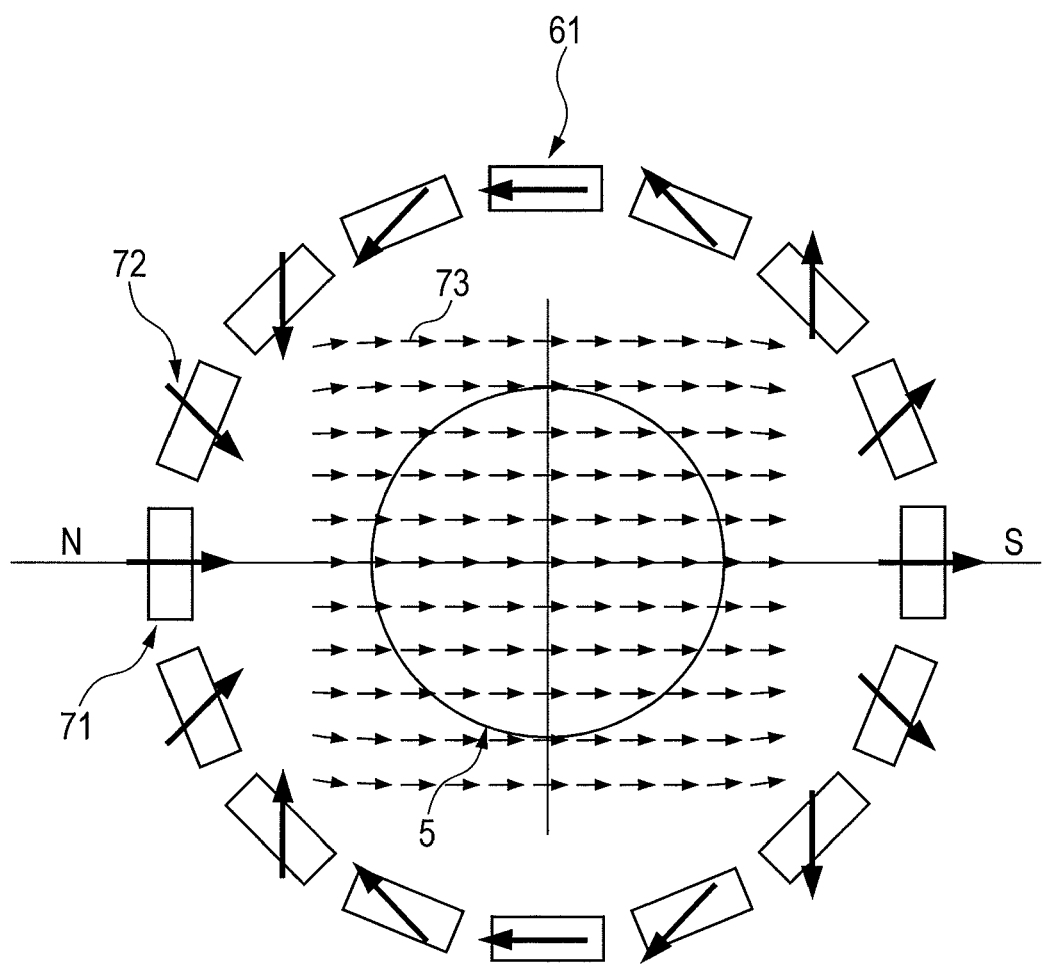
FIG. 7 is a top view for explaining arrangement of a magnetic-field application mechanism (magnetic circuit) illustrated in FIG. 6.

In this embodiment, a so-called Halbach-type magnetic circuit in which a permanent magnet divided into a plurality of blocks (magnet elements 71) are arranged in a ring-shape with the direction of each magnet element 71 (magnetization directions 72) as in FIG. 7 is employed as the magnet 61. With this structure, it becomes possible to apply the magnetic field (magnetic line 73) aligned in parallel with the substrate face and also in parallel in the substrate face to the substrate 5 during cooling. By stopping the substrate 5 at a position within a range of 20 mm above the substrate supporting base 41, for example, without placing the substrate 5 on the cooled substrate supporting base 41 and by setting the input power to the halogen lamp 2 higher than the input power at the heating position P3, it is possible to maintain a high temperature while the magnetic field is applied.

Figure 8A:
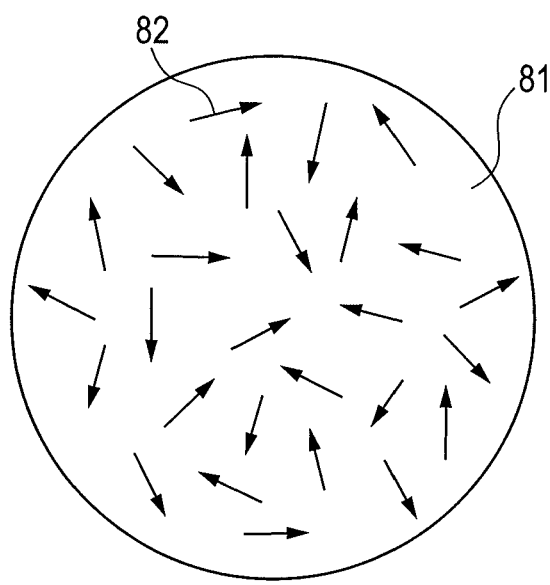
FIG. 8A is a diagram for comparing the magnetization direction of a magnetic film formed on the heat-treated substrate and a diagram illustrating the magnetization direction when the magnetic field is not applied during the heat treatment according to the embodiment of the present invention.
Figure 8B:
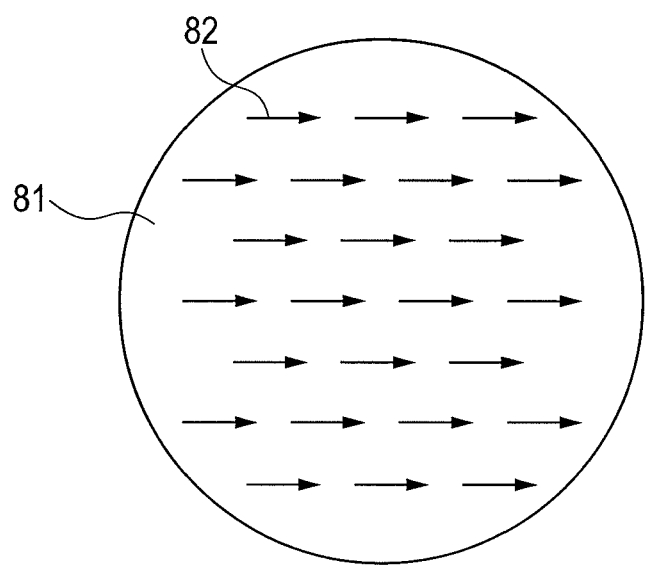
FIG. 8B is a diagram for comparing the magnetization direction of the magnetic film formed on the heat-treated substrate and a diagram illustrating the magnetization direction when the magnetic field is applied during the heat treatment according to the embodiment of the present invention.

By applying the magnetic field so as to be parallel with the substrate during cooling or during heating and cooling, as illustrated in FIGS. 8A and 8B, the magnetization directions of the magnetic film can be aligned in one direction. In FIGS. 8A and 8B, reference numeral 81 denotes a substrate on which the magnetic film is accumulated and reference numeral 82 denotes magnetization.

Hitherto, the magnetization direction has been aligned in one direction by forming a film of the magnetoresistance element by the sputtering apparatus and then, by annealing it in the magnetic field by a heat treatment apparatus (an apparatus different from the sputtering apparatus) capable of applying the magnetic field in the subsequent process. On the other hand, in this embodiment, during the film formation process of the magnetoresistance element, heating and cooling are conducted in the magnetic field. Therefore, the heat treatment process in the magnetic field in the prior-art subsequent process can be skipped.

Fifth Embodiment

In the fourth embodiment, by replacing the permanent magnet with an electromagnet as the magnetic-field application mechanism, the same advantage can be expected. At this time, the electromagnet is preferably configured to apply the magnetic field at least at 25 gauss or more.

Sixth Embodiment

Figure 9:
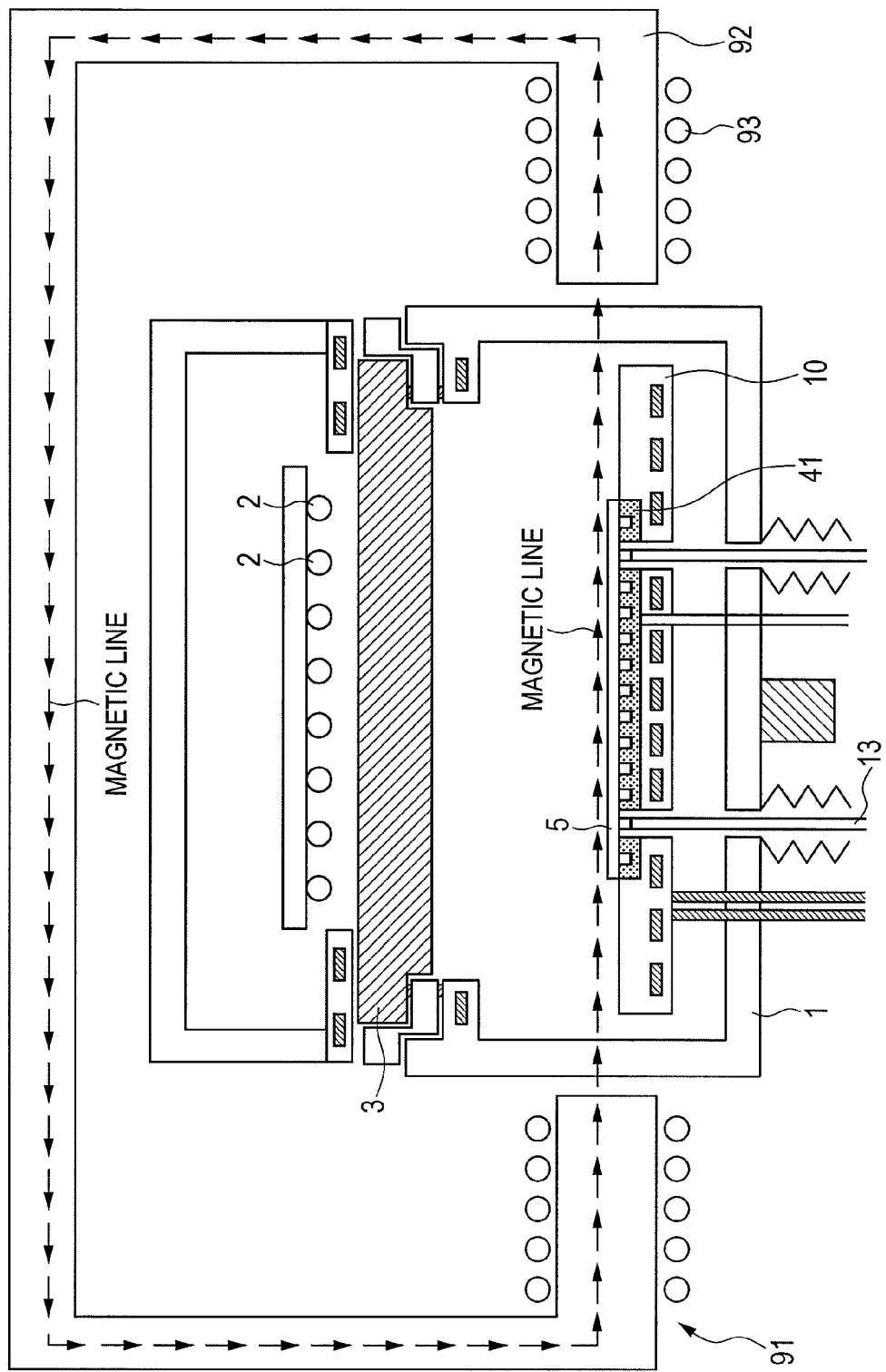
FIG. 9 is a configuration diagram of the vacuum heating/cooling apparatus according to the embodiment of the present invention.

In order to apply stronger magnetic field, in this embodiment, an electromagnet 91 having a yoke 92 and a coil 83 for electromagnet is arranged outside the vacuum chamber 1 as illustrated in FIG. 9.

As an example of a configuration of the electromagnet 91, if the substrate 5 stands still at a predetermined position above the cooling position P1, the electromagnet 91 may be configured to generate magnetic lines aligned substantially in parallel with a treatment face of the substrate 5 and also aligned in parallel in the treatment face. In this case, if the substrate 5 is located at the heating position P3, electric current is not made to flow through the coil 93 for electromagnet. That is, the substrate 5 is heated in the state in which the magnetic field is not applied, and when the substrate temperature reaches the desired temperature, the lift pins 13 are lowered, and the substrate position is moved to a position within 20 mm above the substrate supporting base 43 (the predetermined position). At this time, the power to be input to the halogen lamp 2 is adjusted so that the substrate temperature is maintained at the desired temperature. At the same time, a DC current is made to flow through the coil 93 for electromagnet so as to generate the magnetic field. In this state, the substrate 5 is heated for a desired time and then, power input to the halogen lamp 2 is stopped, and cooling of the substrate 5 is started. In order to effectively cool the substrate 5, as illustrated in the third embodiment, the cooling gas is introduced while the electrostatic chuck is performed. When the substrate temperature reaches the vicinity of the room temperature, power supply to the coil 93 for electromagnet is stopped, and the magnetic field is cancelled.

Also, as another example of the configuration of the electromagnet 91, the electromagnet 91 may be configured to generate the magnetic lines substantially in parallel with the treatment face of the substrate 5 and also aligned in parallel in the treatment face if the substrate 5 stands still at the cooling position P1 (if the substrate 5 is placed on the substrate supporting base 41 as in FIG. 9).

The magnetic-field application mechanism is not limited to the electromagnet but a permanent magnet may be used. Also, the magnetic-field application mechanism such as the electromagnet or permanent magnet is preferably configured so that the magnetic field at least at 25 gauss or more is applied to the substrate.

This process is effective if it is applied after formation of the magnetic film, and with the film configuration illustrated in the first embodiment, if it is applied to the CoFe film on IrMn, the CoFeB film on Ru and the CoFeB film on MgO, high magnetic anisotropy can be given to the magnetic films.

Seventh Embodiment

In this embodiment, in each of the above-described embodiments, by introducing oxygen gas through the gas inlet 19 while the substrate 5 is heated, desorption of oxygen from the MgO film located on the uppermost face of the substrate 5 can be aided, and formation of a MgO film with higher quality can be expected. As described above, in this embodiment, while at least either of the heating treatment and the cooling treatment is conducted, by introducing gas according to the film located on the uppermost face of the film formed on the substrate 5, the film after the treatment can be given a higher quality.

Eighth Embodiment

In the first to seventh embodiments, as the substrate moving mechanism which moves the substrate in the thermal treatment such as the heating treatment and the cooling treatment and stops the substrate at a predetermined position (the cooling position P1, the transfer position P2, the heating position P3 and the like), the lift pins are described. However, in the present invention, the substrate moving mechanism is not limited to the lift pins but any means may be used as long as the substrate can be held at the cooling position P1 during the cooling treatment and at the heating position P3 during the heating treatment and the substrate can be moved between the cooling position P1 and the heating position P3.

Figure 10A:
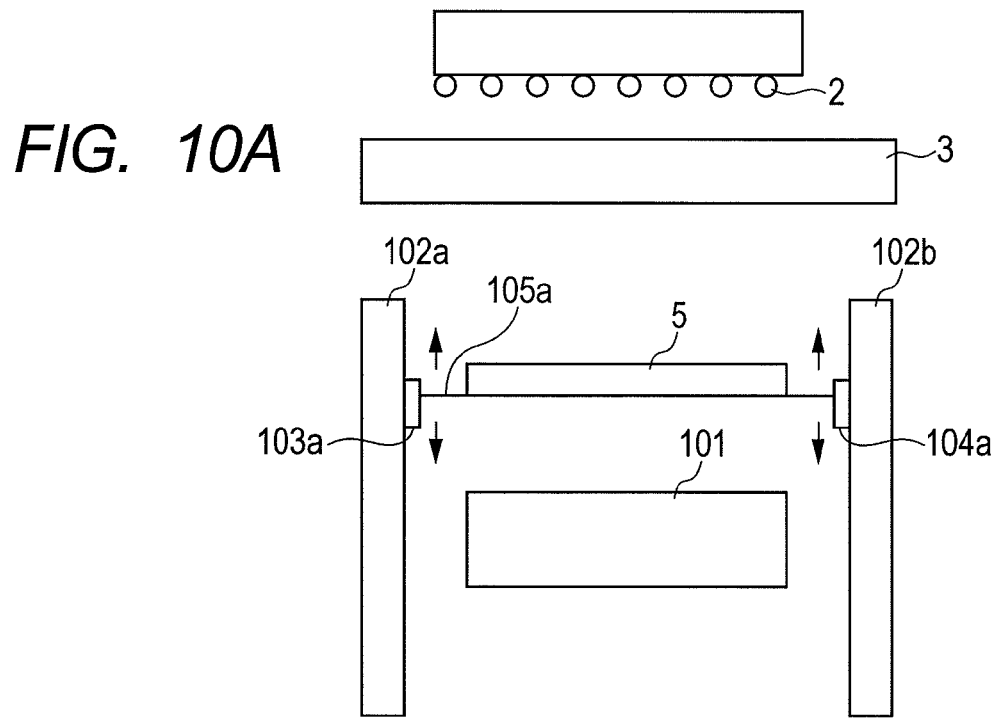
FIG. 10A is a diagram for explaining a mechanism which moves the substrate between the heating position and the cooling position according to the embodiment of the present invention and an outline front view of the mechanism.
Figure 10B:
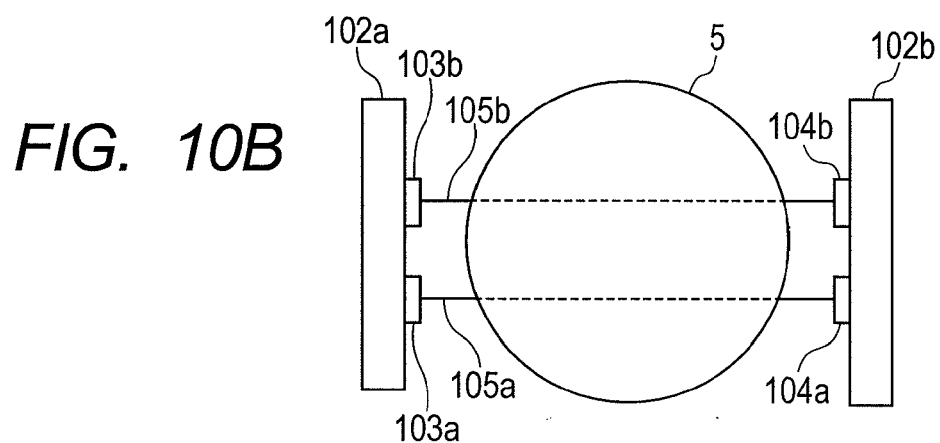
FIG. 10B is a diagram for explaining the mechanism which moves the substrate between the heating position and the cooling position according to the embodiment of the present invention and shows the upper face of the mechanism.
Figure 10C:
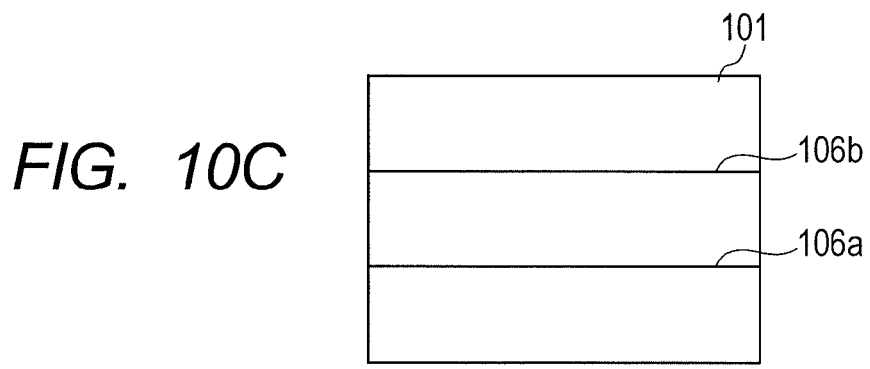
FIG. 10C is a diagram for explaining a mechanism which moves the substrate between the heating position and the cooling position according to the embodiment of the present invention and is a top view of a substrate supporting base when the mechanism is used.

Another example of the substrate moving mechanism is illustrated in FIGS. 10A to 10C.

FIG. 10A is an outline front view of the substrate moving mechanism which moves the substrate between the heating position and the cooling position according to this embodiment, FIG. 10B is a top view of the mechanism, and FIG. 10C is a top view of the substrate supporting base when the mechanism is used. In FIG. 10A, for simplification of the drawing, only the configuration relating to the substrate moving mechanism, the halogen lamp 2 and the quartz window 3 are described.

In FIG. 10A, reference numeral 101 denotes a substrate supporting base having the cooling function similar to that of the substrate supporting base 9. Elevation mechanisms 102a and 102b are provided so as to sandwich a substrate supporting base 101. In each of the elevation mechanisms 102a and 102b, two guide rails are formed in the longitudinal direction. On each of the guide rails of the elevation mechanism 102a, movable parts 103a and 103b movable along the guide rails are mounted. Also, on each of the guide rails of the elevation mechanism 102b, movable parts 104a and 104b movable along the guide rails are mounted. The elevation mechanism 102a (102b) can move the movable parts 103a, 103b (the movable parts 104a and 104b) along the guide rails in accordance with the instruction from the control part 1000.

Reference numerals 105a and 105b denote supporting rods which hold the substrate 5, respectively, and as illustrated in FIG. 10B, one end of the supporting rod 105a is held by the movable part 103a, while the other end is held by the movable part 104a. Also, one end of the supporting rod 105b is held by the movable part 103b, while the other end is held by the movable part 104b. At this time, positions and movement of the movable parts 103a, 103b, 104a and 104b are controlled so that each of the supporting rods 105a and 105b is substantially in parallel with the substrate placing face of the substrate supporting base 101. Therefore, if the substrate 5 is stopped at the cooling position P1 or the heating position P3 or moved between the cooling position P1 and the heating position P3, the substrate 5 can be maintained in parallel with the substrate placing face of the substrate supporting base 101 all the time.

In such configuration, the control part 1000 controls the elevation mechanisms 102a and 102b so that the substrate 5 is placed at the heating position P3 in the heating treatment and controls the elevation mechanisms 102a and 102b so that the substrate 5 is located at the cooling position P1 in the cooling treatment.

If the position where the substrate 5 is placing on the substrate supporting base 101 is set to the cooling position P1, as illustrated in FIG. 10C, it is only necessary to form grooves 106a and 106b fitted with the supporting rods 105a and 105b on the substrate supporting base 101. As a result, when the supporting rods 105a and 105b are fitted in the grooves 106a and 106b, respectively, the substrate 5 is placing on the substrate supporting base 101.

In this embodiment, too, the substrate 5 can be supported not on a plane but by a line, an area in contact with the substrate 5 can be made small, and an effect of the heat capacity of a member (supporting rods 105a and 105b) which supports the substrate 5 in the heating treatment can be reduced. Therefore, the effect of the heat capacity of the supporting rods 105a and 105b can be reduced, and rapid heating and rapid cooling can be realized.

As described above, in the embodiment of the present invention, the substrate moving mechanism has a substrate holding part (for example, the distal ends 13a of the lift pins 13 in the configuration in FIG. 1 and the supporting rods 105a and 105b in the configuration in FIGS. 10A to 10C) which holds the substrate. This substrate supporting part is preferably configured to be in contact with a part of the substrate so as to support the substrate by supporting the substrate by a point or a line. By configuring as above, the effect of the heat capacity of the substrate supporting part on the substrate can be reduced in the thermal treatment. Also, the substrate moving mechanism has a function of stopping the substrate supported by the substrate supporting part at the cooling position and the heating position and moreover of moving the substrate between the cooling position and the heating position. Therefore, the heating treatment and the cooling treatment to the substrate can be conducted at different positions in the same vacuum chamber.

The invention claimed is:

1. A vacuum heating/cooling apparatus that heats/cools a substrate in vacuum, the apparatus comprising:
   a vacuum chamber;
   a radiation energy source that is arranged on an atmosphere side of the vacuum chamber and radiates heating light;
   an incident portion for causing the heating light from the radiation energy source to enter the vacuum chamber;
   a member arranged inside the vacuum chamber and having a substrate supporting base for placing the substrate thereon and a cooling mechanism arranged in contact with the substrate supporting base, the member being coolable by the cooling mechanism; and
   a substrate moving mechanism that has a substrate holding part for holding the substrate, causes the substrate holding part to stand still at a heating position and a cooling position, which is a position different from the heating position, and also moves the substrate holding part between the heating position and the cooling position, wherein
   the heating position is a position where the substrate should be located when being heated, and the cooling position is a position where the substrate should be located when being cooled and is a position where the substrate is placed on the member,
   the substrate supporting base is made of a dielectric body,
   the substrate supporting base has a groove engraved in a face in contact with a back face of the substrate, and the groove is connected to a gas introduction mechanism for introducing or discharging cooling gas from the atmosphere side, and
   the apparatus further comprises a control means for controlling the radiation energy source, the cooling mechanism, and the gas introduction mechanism so that at a predetermined time before a heating treatment is finished, a cooling operation of the cooling mechanism is started and then the heating treatment is finished and at a time that the substrate supporting base is cooled by the cooling mechanism, the cooling gas is introduced into the groove after the substrate is brought into contact with the substrate supporting base.

2. The apparatus according to claim 1, wherein the substrate moving mechanism is lift pins that support the substrate with at least three points.

3. The apparatus according to claim 1, further comprising a magnet arranged outside of a side wall of the cooling mechanism,
   wherein the magnet generates magnetic lines substantially in parallel with a substrate face when the substrate is located at the cooling position, and
   wherein a direction of the magnetic lines is constant in a predetermined direction over a surface of the substrate located at the cooling position.

4. The apparatus according to claim 1,
   wherein the substrate supporting base has a structure of being in contact with wiring for introducing electricity, and
   wherein the wiring is electrically connected to an external power supply.

5. The apparatus according to claim 3, wherein the magnet is surrounded by a reflector which reflects the heating light so that the magnet is not directly irradiated with the heating light.

6. The apparatus according to claim 5, wherein the reflector is cooled by being in contact with a refrigerant.

* * * * *